United States Patent [19]
Mattori et al.

[11] Patent Number: 6,081,539
[45] Date of Patent: Jun. 27, 2000

[54] TUNABLE LASER SOURCE APPARATUS HAVING WIDEBAND OSCILLATION WAVELENGTH CONTINUOUS SWEEP FUNCTION

[75] Inventors: Shigenori Mattori, Sagamihara; Shigeru Kinugawa, Tokyo; Takanori Saitoh, Atsugi, all of Japan

[73] Assignee: Anritsu Corporation, Tokyo, Japan

[21] Appl. No.: 09/281,711

[22] Filed: Mar. 30, 1999

[30] Foreign Application Priority Data

Mar. 31, 1998 [JP] Japan .................................. 10-105589

[51] Int. Cl.[7] ....................................... H01S 3/10
[52] U.S. Cl. ............................. 372/20; 372/32; 372/102; 372/38; 372/33
[58] Field of Search ............................. 372/20, 32, 33, 372/102, 29, 38

[56] References Cited

U.S. PATENT DOCUMENTS

| | | | |
|---|---|---|---|
| 4,309,671 | 1/1982 | Malyon | 372/32 |
| 4,821,273 | 4/1989 | Hori | 372/32 |
| 5,054,028 | 10/1991 | Esherick et al. | |
| 5,491,714 | 2/1996 | Kitamura | |
| 5,493,575 | 2/1996 | Kitamura | 372/20 |
| 5,754,571 | 5/1998 | Endoh et al. | 372/20 |
| 5,862,162 | 1/1999 | Maeda | 372/32 |
| 5,982,794 | 11/1999 | Tamura | 372/32 |

FOREIGN PATENT DOCUMENTS 0 687 045 A2  12/1995  European Pat. Off. .
WO 91/03848   3/1991   WIPO .

OTHER PUBLICATIONS

Patent Abstracts of Japan, vol. 1998, No. 05, Apr. 30, 1998 and JP 10–022585 (Anritsu Corp.), Jan. 23,1998 –Abstract Only.
Mattori, S., et al. : "Active Mode–Hop Suppression in External Cavity Lasers", Technical Digest –Symposium on Optical Fiber Measurements, 15–17 Sep. 1998, pp. 183–186, XP000872088, Boulder, Colorado, U.S.A. –Entire Document.

*Primary Examiner*—Leon Scott, Jr.
*Attorney, Agent, or Firm*—Frishauf, Holtz, Goodman, Langer & Chick, P.C.

[57] ABSTRACT

A tunable laser source apparatus includes an external cavity. The external cavity includes a semiconductor laser and a diffraction section. At least one laser output end facet of the semiconductor laser is covered with an AR coating. The diffraction section includes a first reflector and a diffraction grating, and has wavelength selectivity with which light emerging from the end facet of the semiconductor laser which is covered with the AR coating is received, and light having a predetermined wavelength is selected and reflected toward the semiconductor laser. The semiconductor laser further includes an angle detection section and a control section. The angle detection section detects the angle defined by the optical path of the light emerging from the semiconductor laser and the optical path of the diffracted light reflected by the diffraction section. The control section controls at least the cavity length of the external cavity or the selected wavelength of the diffraction section to set the angle detected by the angle detection section to zero.

15 Claims, 9 Drawing Sheets

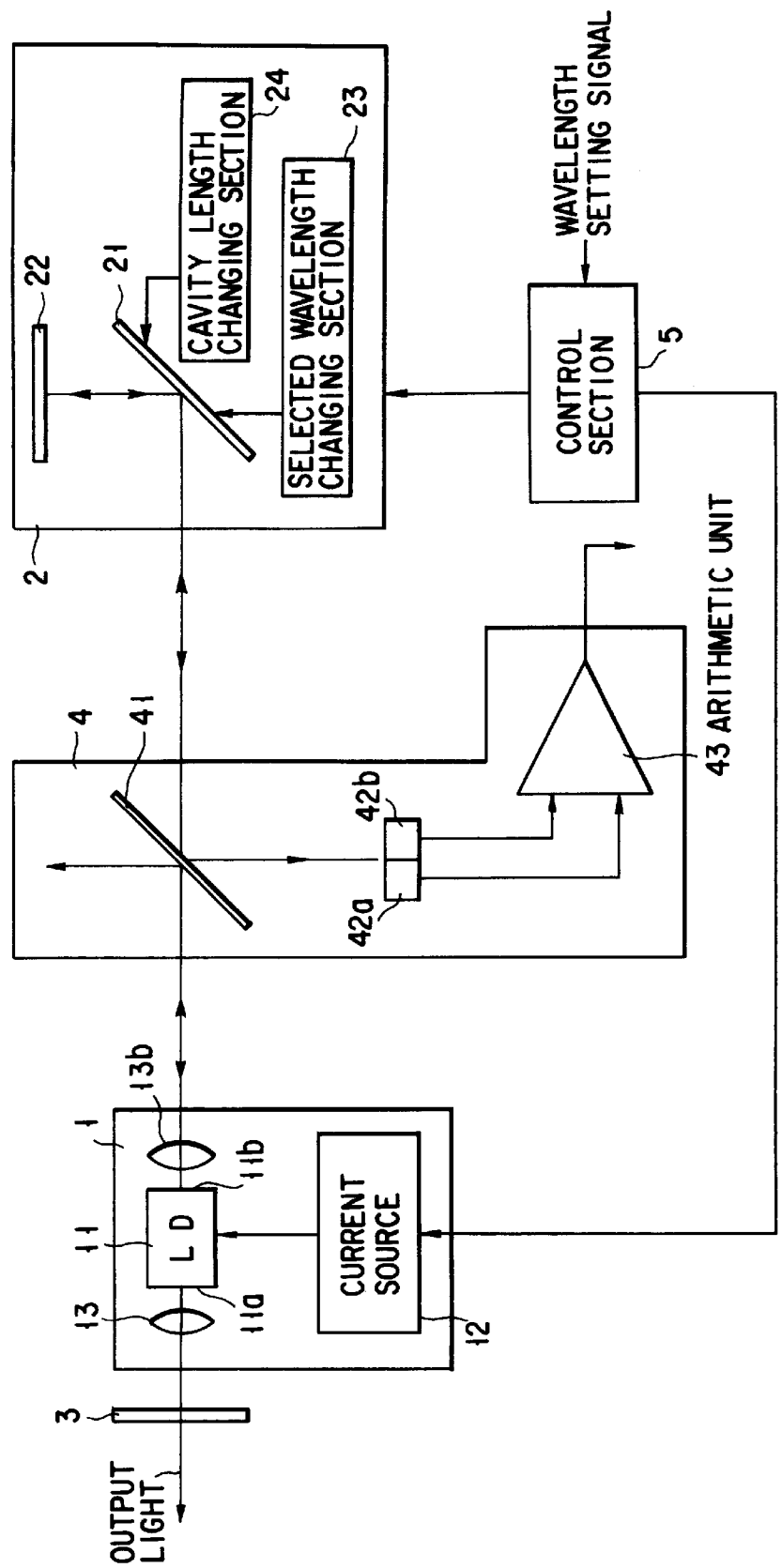
F I G. 1

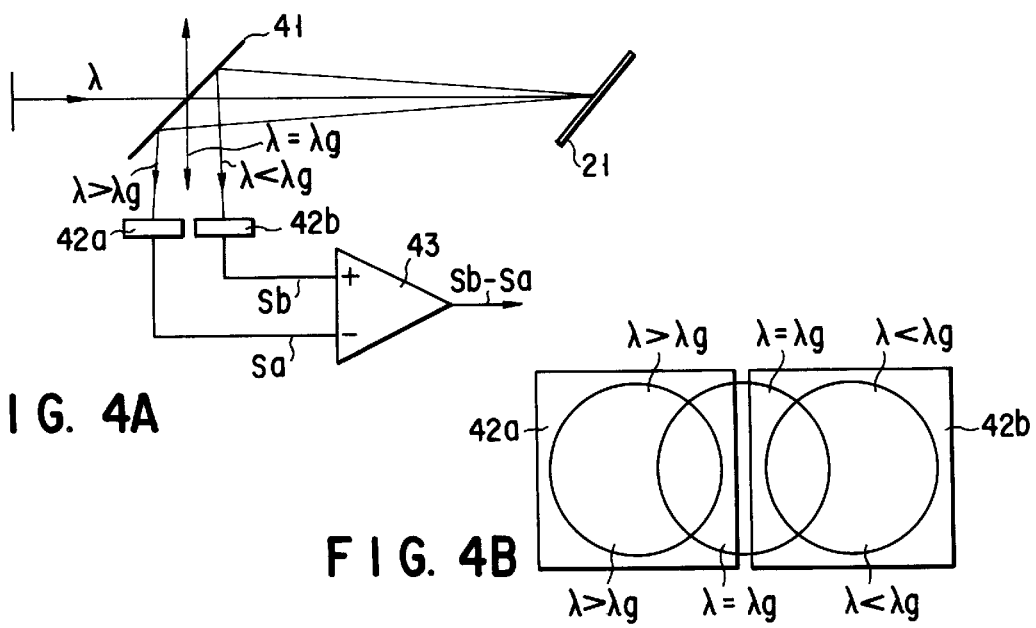
FIG. 4A
FIG. 4B
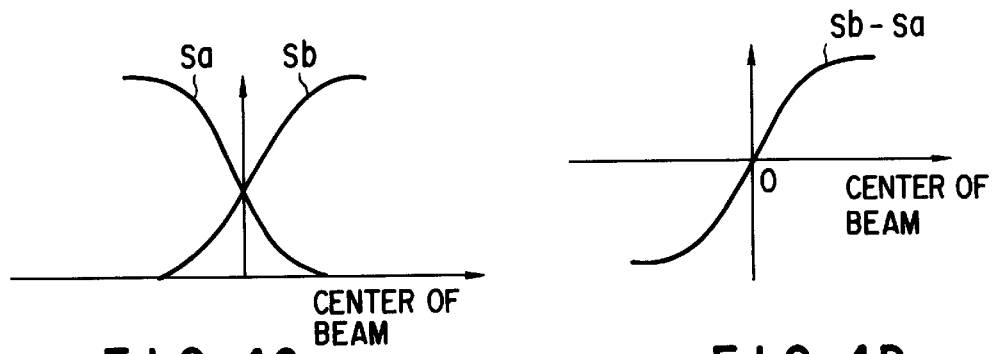
FIG. 4C
FIG. 4D
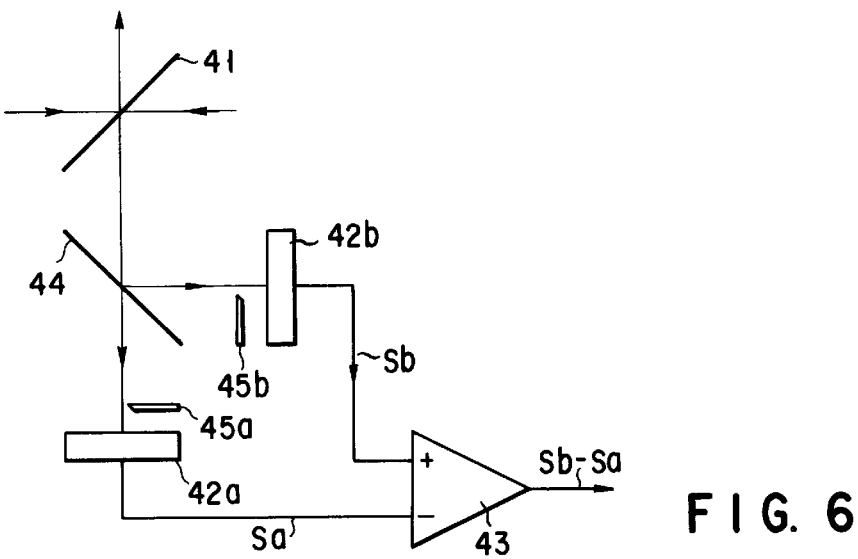
FIG. 6

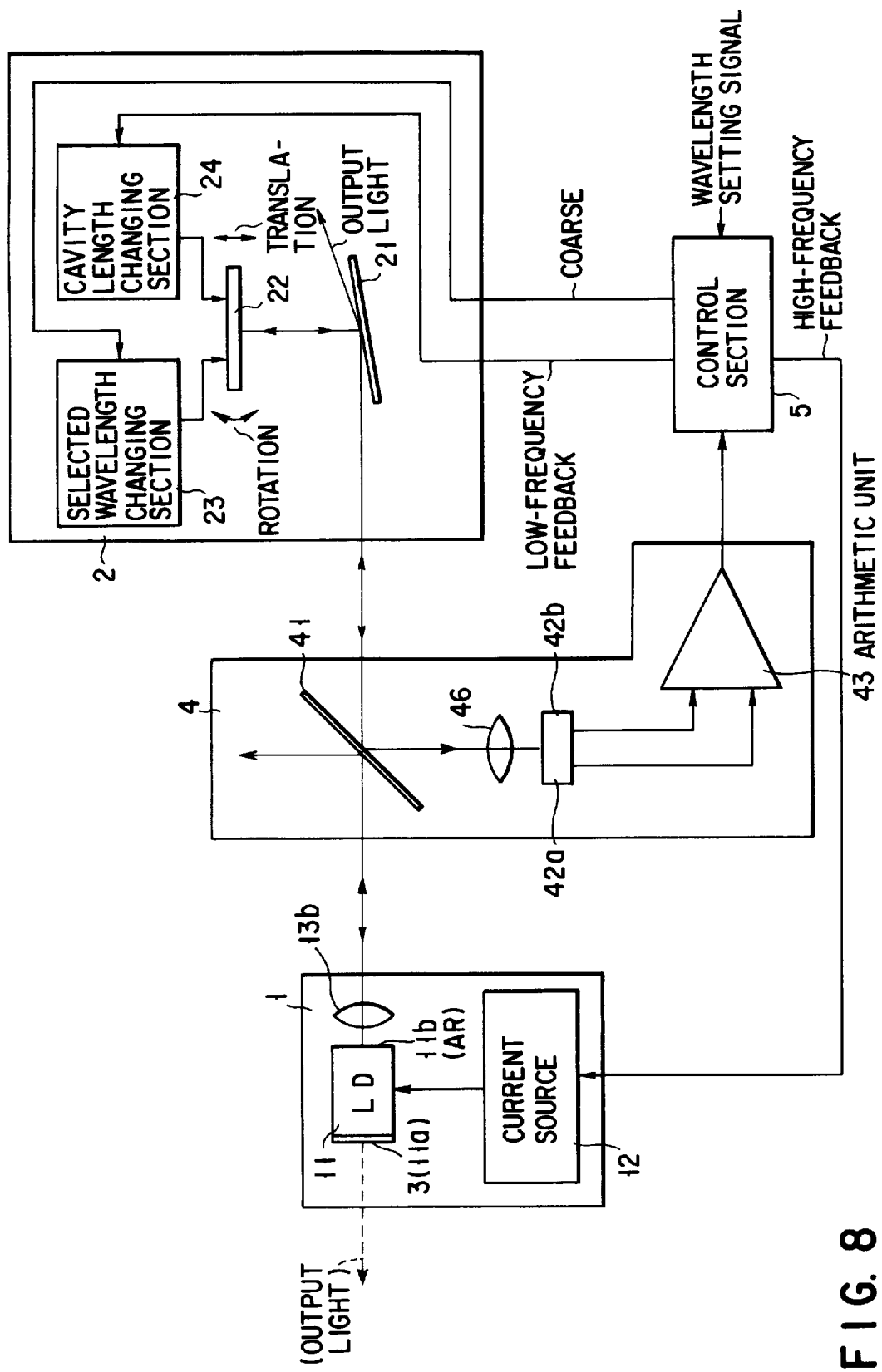
F I G. 8

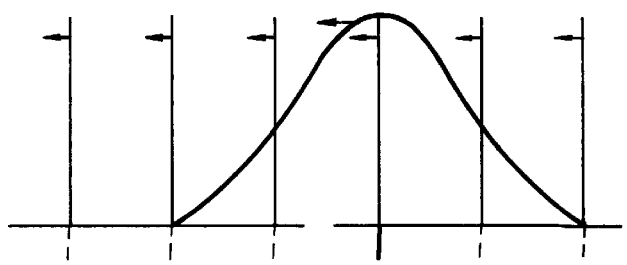
FIG. 10A
(PRIOR ART)
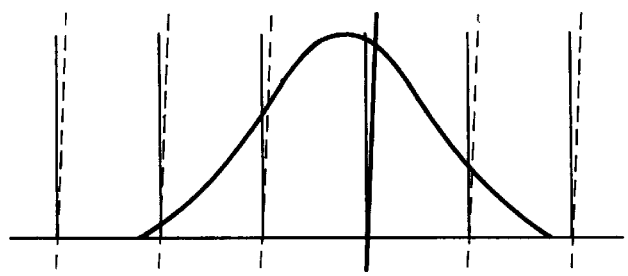
FIG. 10B
(PRIOR ART)
FIG. 10C
(PRIOR ART)
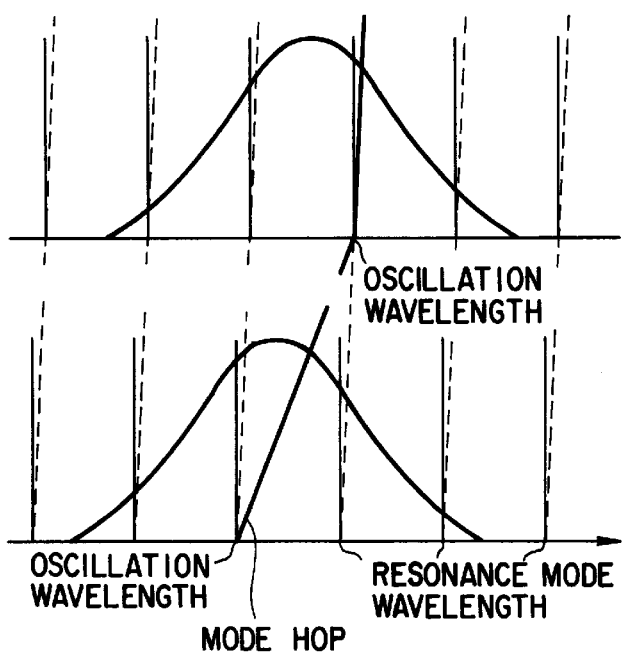
FIG. 10D
(PRIOR ART)
OSCILLATION WAVELENGTH
MODE HOP
RESONANCE MODE WAVELENGTH
WAVELENGTH
DECREASE(L) DECREASE(θ)
FIG. 10E
(PRIOR ART)
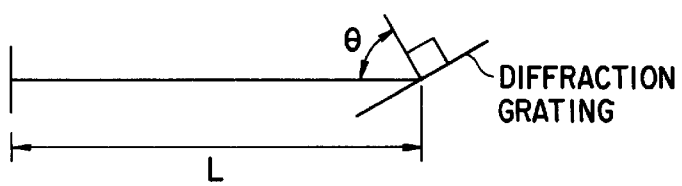
DIFFRACTION GRATING

TUNABLE LASER SOURCE APPARATUS HAVING WIDEBAND OSCILLATION WAVELENGTH CONTINUOUS SWEEP FUNCTION

BACKGROUND OF THE INVENTION

The present invention relates to a laser source apparatus capable of continuously changing the oscillation wavelength, which is used in the fields of optical communications and precision measurement and, more particularly, to a tunable laser source apparatus which can continuously sweep the oscillation wavelength in a wideband by using an optical amplification element, e.g., a semiconductor laser (to be referred to as an LD hereinafter), in a wide wavelength range.

Recently, in the fields of optical communications and precision measurement, the application field of a heterodyne method, in which the frequency difference between two beams is measured in accordance with an electrical signal received upon superposing of the two beams, has been expanding.

In general, the frequency difference between beams that can be detected by a photodetector is electrically limited. In practice, the upper limit of this frequency difference is about 10 GHz.

If, therefore, one of two beams is used as a target beam to be measured, and the other is used as a reference beam, the frequency of the target beam must be tuned into a frequency within about 10 GHz.

When the high-order sideband spectrum of the target beam modulated with several GHz is to be measured, and the frequency and shape of an absorption line of atoms, molecules, and the like are to be observed, a laser source apparatus capable of continuously sweeping the oscillation wavelength near a desired wavelength is required.

As such a laser source apparatus, a tunable laser source apparatus called an external cavity laser is popular, in which light emerging from an optical amplification element having a wide gain band, e.g., a laser diode (LD), is fed back as light in a desired wavelength range through a wavelength selection element such as a diffraction grating disposed outside the optical amplification element, thereby causing laser oscillation within the wavelength range.

In such tunable laser source apparatuses, a wavelength selection element that is used most widely is a diffraction grating.

In this case, the wavelength to be selected is changed by changing the angle of the diffraction grating with respect to the incidence direction of light.

FIG. 9A shows the arrangement of a typical external cavity laser using a diffraction grating.

FIGS. 9B, 9C, 9D, and 9E show the principle of oscillation wavelength determination in the external cavity laser shown in FIG. 9A.

As shown in FIG. 9A, this external cavity laser is comprised of an LD 11 having one end facet 11b covered with an AR (Anti-Reflection) coating, lenses 13a and 13b, and a diffraction grating 21 disposed on the end facet 11b side.

The diffraction grating 21 can be rotated and translated. The diffraction grating 21 and the other end facet (without any AR coating) 11a of the LD 11 constitute an external cavity.

The arrangement of the diffraction grating in which the wavelength of light received from the LD and directly diffracted toward the LD by the diffraction grating is used as a selected wavelength is called a Littrow mounting.

The oscillation wavelength of an external cavity laser including a wavelength selection element is determined by two factors regardless of whether such a Littrow mounting is used.

The first factor is the wavelength that satisfies a resonance condition determined by the optical length of the overall cavity that causes laser oscillation.

In the optical cavity shown in FIG. 9B, let L be the optical length (to be referred to as the cavity length hereinafter) of the overall cavity, ν be the frequency of input light, P0 be the power of input light, and P1 be the power of output light.

As is known, if the speed of light is represented by c, the free spectral range (to be referred to as the FSR hereinafter) is expressed as $FSR=c/2L$.

As shown in FIG. 9C, each FSR includes a plurality of resonance frequencies at which the transmittance (output power P1/input power P0) becomes maximum.

When a given resonance frequency is n times the FSR, this frequency is called the nth-order mode.

Let a wavelength corresponding to a resonance frequency be called a resonance wavelength.

Another factor that determines the oscillation wavelength of the external cavity laser is the gain distribution that is band-limited by the diffraction grating shown in FIG. 9D or a wavelength selection element in general.

When an optical amplification element having a gain in a wide band, such as an LD, is used, the gain in the selected wavelength range of the diffraction grating can be regarded as constant. For this reason, the band-limited gain distribution can be regarded as identical to the selected wavelength spectrum of the diffraction grating.

A peak wavelength of a selected wavelength spectrum will therefore be simply referred to as a selected wavelength hereinafter.

As shown in FIG. 9E, therefore, the external cavity laser starts oscillation in one of the above modes which is positioned at the frequency at which the highest gain can be obtained.

In this case, in general, the selected wavelength does not coincide with the oscillation wavelength.

Consider sweeps of the oscillation wavelength.

FIGS. 10A to 10E show a change in oscillation wavelength in a state wherein the oscillation wavelength differs in change rate from the selected wavelength.

As the cavity length L and an input angle θ of light on the diffraction grating decrease, as schematically shown in FIG. 10E, the resonance wavelength and the selected wavelength shift to the short wavelength side, as shown in FIGS. 10A, 10B, 10C, and 10D.

When the resonance wavelength in the current oscillation mode differs from the selected wavelength by about ½ the FSR at this time, the oscillation wavelength shifts from the current oscillation mode to an adjacent mode to make a shift from the state in FIG. 10C to the state in FIG. 10D. As a result, the oscillation wavelength discontinuously changes.

This phenomenon is called a mode hop or mode jump.

To continuously change the oscillation wavelength throughout a wide band, a mode hop must be prevented by synchronously changing the resonance wavelength at which oscillation is being caused and the selected wavelength, i.e., simultaneously changing them while appropriately maintaining the relationship between the cavity length and the angle of the diffraction grating in the external cavity laser based on the Littrow mounting.

Conventional countermeasures against a mode hop have been based on two concepts.

A technique based on one concept aims at realizing a mechanism of capable of simultaneously changing the resonance wavelength and the selected wavelength while maintaining their relationship with one controlled variable to prevent a mode hop.

According to this mechanism, if the rotation center of the diffraction grating is set at a proper position, changes in the angle of the diffraction grating and cavity length can be kept at a predetermined ratio by only changing the rotational angle of the diffraction grating.

A technique based on the other concept aims at increasing the degree of freedom in control on the resonance wavelength and selected wavelength with a plurality of controlled variables.

According to the simplest example of this technique, the angle of the diffraction grating and the resonance wavelength, i.e., the cavity length, are independently changed on the basis of a combination of controlled variables obtained in advance in accordance with the oscillation wavelength.

In general, in an external cavity laser based on the above technique using one controlled variable, a laser medium, a lens, and the like are arranged, and they have wavelength dispersion characteristics, so the continuous wavelength sweep range is limited with the use of only the simple mechanism of keeping changes in the angle of the diffraction grating and cavity length at a predetermined ratio.

According to the technique using a plurality of controlled variables, although the continuous wavelength sweep range is not limited by the wavelength dispersion characteristics of elements in the external cavity laser, it is not easy to sweep the oscillation wavelength in a wide band while matching the oscillation wavelength with the selected wavelength with high precision by only setting the cavity length and the angle of the diffraction grating to values obtained in advance in accordance with the oscillation wavelength.

In addition, in the technique using a plurality of controlled variables, appropriate combinations of angles and cavity lengths as controlled variables must be obtained in advance by experiment and stored as parameters.

In each of the mode hop prevention techniques described above, although the oscillation wavelength can be continuously swept in a specific wavelength range, it is difficult to perform a continuous wavelength sweep throughout the entire oscillation band of the LD. In some cases, multi-mode oscillation occurs or no oscillation can be caused at a specific wavelength.

The technique using a plurality of controlled variables, in particular, performs wavelength sweeps, continuously relying on the mechanical precision at the initial adjustment and the parameters determined by experiment, and hence is susceptible to external disturbances, e.g., changes in cavity length and the like due to changes in ambient temperature.

In addition, each of the mode hop prevention techniques described above is susceptible to slight plastic deformation of components due to a shock and the like and changes over time.

Furthermore, in an adjustment stage for a conventional external cavity laser, wavelengths at which mode hops occur are checked while a movable portion supporting a diffraction grating or the like is moved to change the oscillation wavelength near a desired wavelength, and the laser is adjusted to increase the interval of the checked wavelengths, i.e., the continuous sweep range.

In this case, since there is no observation variable that indicates a direction of adjustment, a search for the maximum point of a continuous sweep range is performed by a trial-and-error method. This hinders an increase in productivity.

BRIEF SUMMARY OF THE INVENTION

The present invention has been made in consideration of the above situation, and has as its first object to provide a tunable laser source apparatus which includes an effective means for detecting the difference between the oscillation wavelength and the selected wavelength, which causes a mode hop, together with a sign, and can make systematic adjustment for the prevention of a mode hop independently of a trial-and-error method.

It is the second object of the present invention to provide a tunable laser source apparatus which can prevent a mode hop, continuously sweep the oscillation wavelength near a desired wavelength in the entire oscillation band of an optical amplification element, and has a long-term stability without adjustment.

In order to achieve the above objects, according to an aspect of the present invention, there is provided a tunable laser source apparatus comprising:

a semiconductor laser for oscillating laser light;

diffraction means for diffracting the laser light oscillated by the semiconductor laser and feeding back laser light, of the diffracted laser light, which has a predetermined wavelength to the semiconductor laser; and angle detection means for receiving part of the laser light fed back to the semiconductor laser and detecting an angle defined by an optical path of the laser light fed back to the semiconductor laser and an optical path of the laser light oscillated by the semiconductor laser.

In addition, in order to achieve the above objects, according to another aspect of the present invention, there is provided a tunable laser source apparatus including an external cavity having a semiconductor laser having at least one laser output end facet covered with an AR coating and diffraction means including a first reflector and a diffraction grating and having wavelength selectivity with which light emerging from the end facet of the semiconductor laser which is covered with the AR coating is received and light having a predetermined wavelength is selected and reflected toward the semiconductor laser, comprising:

angle detection means for detecting an angle defined by an optical path of the light emitted by the semiconductor laser and an optical path of the diffracted light reflected by the diffraction means; and a control section for controlling at least one of a cavity length of the external cavity and a wavelength selected by the diffraction means so as to set the angle detected by the angle detection means to zero.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a tunable laser source apparatus according to the first embodiment of the present invention;

FIGS. 3A to 3F are views for explaining the relationship between the oscillation wavelength and the diffraction direction of a diffraction grating, in which FIGS. 3A and 3E show a case wherein the oscillation wavelength and the selected wavelength coincide with each other, FIGS. 3B and 3F show a case wherein the oscillation wavelength is shorter than the selected wavelength, and FIGS. 3C and 3D show a case wherein the oscillation wavelength is longer than the selected wavelength;

FIGS. 4A to 4D are views for explaining the operation of an angle detection section in FIG. 2, in which FIG. 4A is a view showing the arrangement of the angle detection section, FIG. 4B is a view showing the positional relationship between photodetectors and beams, and FIGS. 4C and 4D are graphs for explaining detection signals and the positional relationship between the photodetectors and the beams;

FIGS. 5A to 5D are views for explaining the discrimination sensitivity of an error signal from the angle detection section, in which FIG. 5A is a graph showing the relationship between the normalized discrimination signal and the irradiation point displacement, FIG. 5B is a graph showing the relationship between the normalized intensity and the distance, and FIGS. 5C and 5D are views respectively showing examples of the shape of the light-receiving areas of a bisection photodetector with and without a space between the light-receiving areas;

FIG. 6 is a block diagram showing another arrangement of an angle detection section according to the present invention;

FIG. 8 is a block diagram showing a tunable laser source apparatus according to the fourth embodiment of the present invention;

FIGS. 9A to 9E are views for explaining the principle of oscillation wavelength determination in a conventional external cavity laser using a diffraction grating, in which FIG. 9A is a view showing the arrangement of the external cavity laser using the diffraction grating, FIG. 9B is a view showing an optical cavity, FIG. 9C is a graph showing the transmittance, FIG. 9D is a graph showing the relationship between the wavelength and the gain, and FIG. 9E is a graph showing the oscillation wavelength, selected wavelength, and resonance wavelength; and FIGS. 10A to 10E are views for explaining a change in oscillation wavelength in a state wherein the oscillation wavelength differs in change rate from the selected wavelength in the prior art, in which FIGS. 10A to 10D are graphs showing the relationship between the oscillation wavelength, selected wavelength, and resonance wavelength in each stage in which a cavity length L and an input angle θ sequentially change, and FIG. 10E is a schematic view showing the relationship between the cavity length L and the input angle θ.

DETAILED DESCRIPTION OF THE INVENTION

Figure 2:
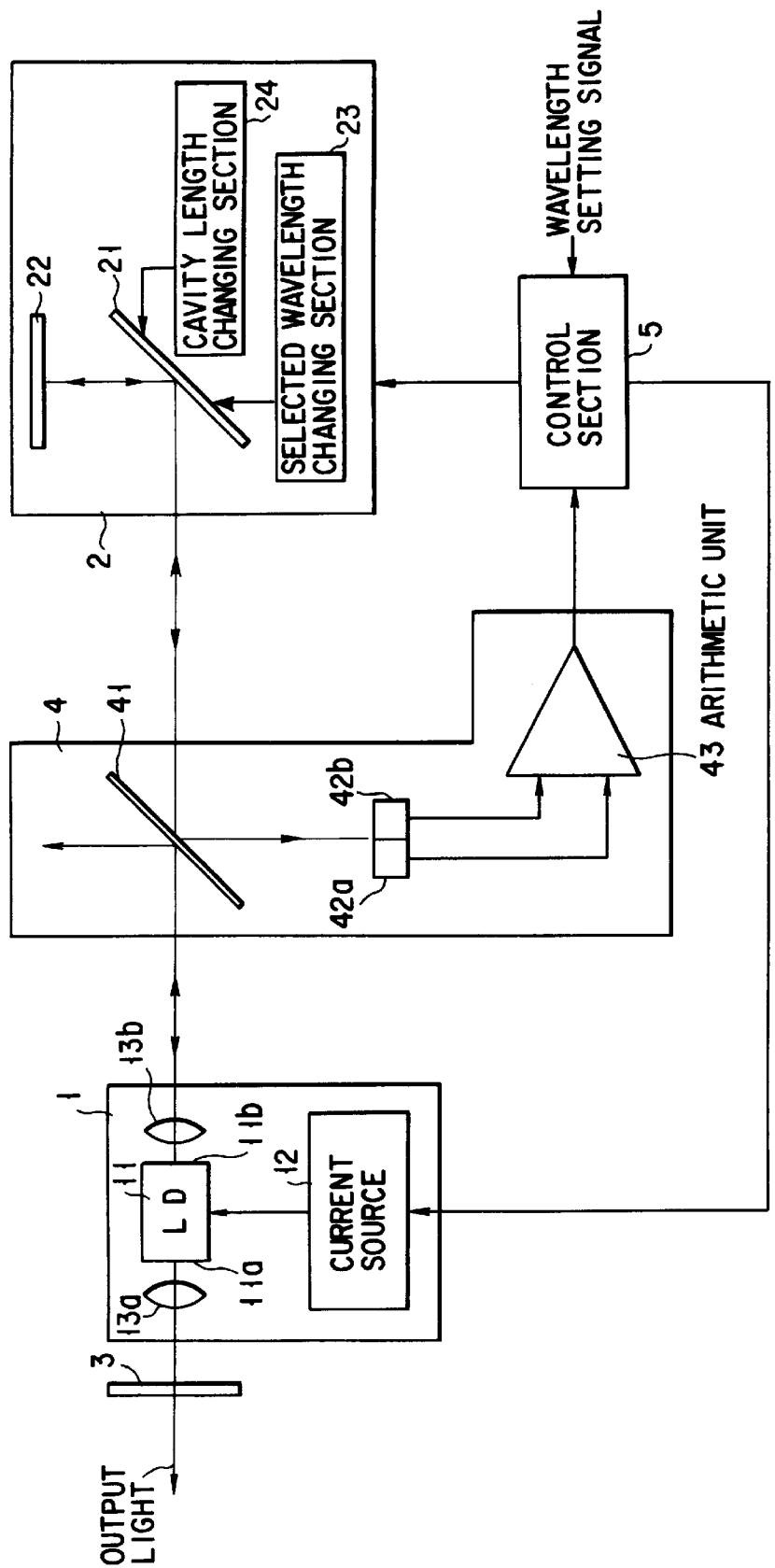
FIG. 2 is a block diagram showing a tunable laser source apparatus according to the second embodiment of the present invention.

Reference will now be made in detail to the presently preferred embodiments of the invention as illustrated in the accompanying drawings, in which like reference characters designate like or corresponding parts throughout the several drawings.

An outline of the present invention will be described first.

The above drawbacks in the prior art are mainly caused by the following two factors.

The first factor is that there has been no effective technique of detecting an observation indicating the difference between the oscillation wavelength and the selected wavelength, which causes a mod hop.

Derived from the first factor, the second factor is that each conventional mode hop prevention technique is a technique of performing control based on controlled variables obtained in advance in accordance with the oscillation wavelength. From another viewpoint, each conventional technique must be based on the concept of so-called open loop control. That is, control is entirely based on the initial settings.

According to the first aspect of the present invention, the apparatus uses a technique of detecting a change in the angle of the optical path of light fed back from the diffraction grating to the LD as an observation variable including information about the difference between the oscillation wavelength and the selected wavelength.

More specifically, the tunable laser source apparatus according to the first aspect of the present invention includes a semiconductor laser for oscillating laser light, a diffraction means for diffracting the laser light and feeding back laser light, of the diffracted laser light, which has a predetermined wavelength to the semiconductor laser, and an angle detection means for receiving part of the laser light fed back to the semiconductor laser and detecting the angle defined by the optical path of the laser light fed back to the semiconductor laser and the optical path of the laser light oscillated by the semiconductor laser.

According to the second aspect of the present invention, closed loop control for determining a controlled variable to be fed back based on the above observation variable is used.

More specifically, there is provided a tunable laser source apparatus including an external cavity having a semiconductor laser having at least one end facet (, from which laser light is emitted,) covered with an AR coating and a diffraction means including a first reflector and a diffraction grating and having wavelength selectivity with which light emerging from the end facet of the semiconductor laser which is covered with the AR coating is received and light having a predetermined wavelength is selected and reflected toward the semiconductor laser, comprising an angle detection means for detecting an angle defined by an optical path of the light emitted by the semiconductor laser and an optical path of the diffracted light reflected by the diffraction means, and a control section for controlling at least one of a cavity length of the external cavity and a wavelength selected by the diffraction means so as to set the angle detected by the angle detection means to zero.

In general, closed loop control has been widely used as the most standard engineering means but has not been used for the prevention of a mode hop for the following reasons. First, no appropriate observation variable with sufficient discrimination sensitivity has been found. Second, there has been opposition, based on a preconceived notion, against insertion of a demultiplexer and the like in a resonator for the purpose of obtaining such an observation variable.

The former problem can be easily solved by detecting a change in the angle of light fed back from the diffraction grating as described later.

With regard to the latter problem, owing to the recent advances in the characteristics of LDs, many laser source apparatuses can satisfactorily oscillate by increasing the injection currents even with a loss of 90% (10 dB) or more in one way in the cavity. Hence, no technical problem is posed.

The influence of the difference between the oscillation wavelength and the selected wavelength on the diffraction direction and a control technique will be described below by taking an external cavity laser based on the Littrow mounting as an example.

FIGS. 3A to 3F are schematic views showing an external cavity laser based on the Littrow mounting and the diffraction direction of light having the oscillation wavelength.

Figure 3A:
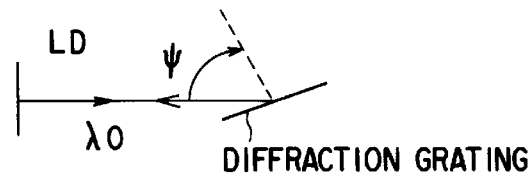

Assume that an oscillation wavelength $\lambda 0$ and a selected wavelength $\lambda g$ coincide with each other in the state shown in FIG. 3A, and this state is the initial state.

As shown in FIG. 3A, if the angle of the optical axis traveling from the LD to the diffraction grating, which is measured upward, is represented by $\phi$, the diffracted light in this state travels in the direction expressed by $\phi=0$.

Figure 3B:
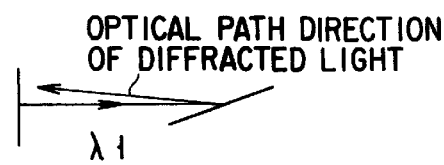

FIG. 3B shows a case wherein only the cavity length decreases while the angle of the diffraction grating does not change from that in the initial state.

In this case, an oscillation wavelength $\lambda 1$ becomes $\lambda 1 < \lambda g$ in accordance with the cavity length.

Since the angle of the diffraction grating remains the same, the diffracted light travels in the direction expressed by $\phi > 0$.

Assume that each angle of diffracted light in this specification means an angle within a projection plane on the drawing area, and any argument in a direction perpendicular to the drawing area can be neglected.

Figure 3C:
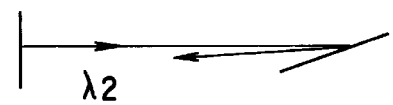
Figure 3D:
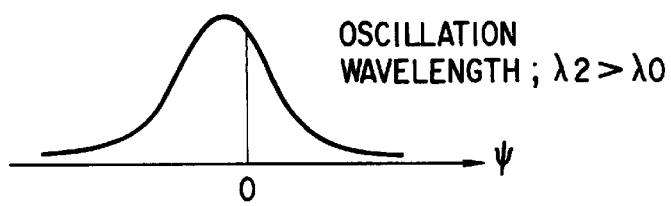
Figure 3E:
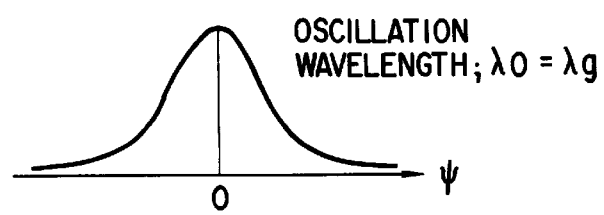
Figure 3F:
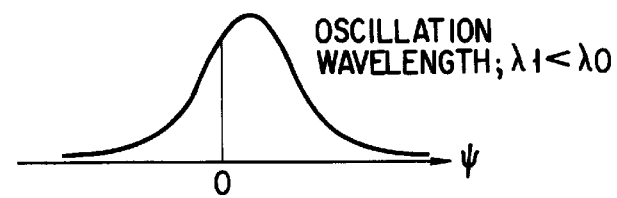

Changes in angle are illustrated in an exaggerated form in FIGS. 3A to 3F. In practice, however, slight changes in angle are targeted. As shown in FIGS. 3D to 3F, most of diffracted light is fed back to the LD to maintain laser oscillation.

In contrast to the case in FIG. 3B, when only the cavity length increases, an oscillation wavelength $\lambda 2$ becomes $\lambda 2 > \lambda g$. As shown in FIG. 3C, the diffracted light travels in the direction expressed by $\phi < 0$.

At this time, therefore, the angle $\phi$ of the light traveling from the diffraction grating to the LD is almost proportional to a difference $\lambda g - \lambda$ between the selected wavelength $\lambda g$ and the oscillation wavelength $\lambda$.

Assume that the cavity length is to be adjusted while the angle of the diffraction grating is fixed. In this case, if adjustment is performed such that the cavity length is increased in the presence of an upward angle, and is decreased in the presence of a downward angle, the selected wavelength and the oscillation wavelength can be systematically and easily made to coincide with each other.

If such adjustment is performed by an automatic control means in the same manner as described above, closed loop control can be realized.

When adjustment or control is performed to make the oscillation wavelength coincide with the selected wavelength in this manner, a mode hop can be prevented.

The embodiments of the present invention based on the above outline will be described in detail next with reference to the views of the accompanying drawing.

(First and Second Embodiments)

FIG. 1 is a block diagram showing a tunable laser source apparatus according to the first embodiment of the present invention which corresponds to the first aspect described above.

FIG. 2 is a block diagram showing a tunable laser source apparatus according to the second embodiment of the present invention which corresponds to the second aspect described above.

Since the embodiments according to the first and second aspects of the present invention described above are the same except for execution/inexecution of closed loop feedback control from an angle detection section 4 (to be described later), the overall embodiment according to the second aspect will be mainly described below with reference to FIG. 2.

As shown in FIG. 2, a diffraction section 2 including a diffraction grating 21 and a first reflector 22, an optical amplification section 1, and a second reflector 3 constitute an external cavity laser.

The optical amplification section 1 is comprised of an LD 11, a current source 12 for driving the LD 11, and lenses 13a and 13b. In this case, input/output end facets 11a and 11b of the LD 11 are covered with AR coatings.

According to a Littrow mounting, the diffraction grating 21 also serves as the first reflector 22.

The diffraction section 2 includes a selected wavelength changing section 23 for rotating the diffraction grating 21 or the first reflector 22 in response to a control signal received from the control section 5, and a cavity length changing section 24 for translating the diffraction grating 21 and the first reflector 22.

The above arrangement is the same as that of a conventional tunable laser source apparatus.

In addition to the above arrangement, the present invention includes the angle detection section 4 for outputting an angle detection signal by detecting the angle defined by the optical path of light traveling from the diffraction grating 21 to the LD 11 and the optical path of light traveling from the LD 11 to the diffraction grating 21.

The angle detection signal detected by the angle detection section 4 is input, as an error signal for closed loop feedback control, to a control section 5.

The control section 5 outputs a predetermined control signal to the current source 12, the selected wavelength changing section 23, and the cavity length changing section 24 on the basis of an externally input wavelength setting signal as in the prior art, and also outputs a feedback control signal corresponding to at least one of these control objects upon adding it to the predetermined control signal on the basis of the error signal detected by the angle detection section 4.

In this case, the angle detection section 4 is comprised of a beam splitter 41, photodetectors 42a and 42b, and an arithmetic unit 43.

Of these components, the beam splitter 41 splits part of light traveling from the diffraction section 2 to the optical amplification section 1 and makes the extracted light strike the photodetectors 42a and 42b.

These photodetectors 42a and 42b are arranged to respectively receive halves of light split by the beam splitter 41 when the angle defined by the optical path of light traveling from the diffraction grating 21 to the LD 11 and the optical path of light traveling from the LD 11 to the diffraction grating 21 is 0°.

The arithmetic unit 43 outputs an angle detection signal in an amount corresponding to the angle defined by the optical path of light traveling from the optical amplification section 1 to the diffraction section 2 and the optical path of light traveling from the diffraction section 2 to the optical amplification section 1 on the basis of detection signals from the photodetectors 42a and 42b.

In this case, the arithmetic unit 43 simply outputs the difference between the two light reception signals from the photodetectors 42a and 42b as an error signal.

The cavity length may be changed by using a method of translating the second reflector 3, a method of changing the driving current supplied to the LD, a method of inserting a transparent medium in the external cavity to change the optical path length and changing the thickness or refractive index of the medium, or the like instead of placing the cavity length changing section 24 in the diffraction section 2 as in this case.

The omission of the closed loop portion, which is used for feedback from the control section 5 to the diffraction section 2 on the basis of an error signal from the angle detection section 4, from the second embodiment amounts to the first embodiment shown in FIG. 1 as the embodiment according to the first aspect of the present invention described above.

In the first embodiment as well, an error signal can be extracted as the above angle detection signal from the angle detection section 4. By using the error signal, therefore, for example, adjustment for wavelength and the angle of the diffraction grating and the like can be made.

The operation of the angle detection section 4 will be described below with reference to FIGS. 4A to 4D.

FIG. 4A schematically shows the arrangement of the angle detection section 4 and the positions of beams therein.

FIG. 4B shows the positions of the light-receiving areas of the photodetectors 42a and 42b and beams and the relationship in magnitude between the wavelengths.

As described above, the angle of the optical path of light traveling from the diffraction grating and the LD changes depending on the relationship in magnitude between a selected wavelength λg and an oscillation wavelength λ.

The beam splitter 41 and the photodetectors 42a and 42b are arranged in accordance with the positional relationship shown in FIG. 4A. In this arrangement, the arithmetic unit 43 calculates the difference between two light reception signals to detect an argument.

As shown in FIG. 4B, according to the relationship between the detection areas of the photodetectors 42a and 42b and the beams, the photodetectors 42a and 42b, each having an effective detection area larger than the diameter of each beam, may be arranged such that the power of light detected by the two photodetectors become equal to each other when the oscillation wavelength λ coincides with the selected wavelength λg, i.e., the laser oscillates at a wavelength at which no mode hop easily occurs.

If, for example, the actual size of each detection area is excessively small as compared with the diameter of a beam, the diameter of the beam may be adjusted by using an appropriate lens or the like.

FIG. 4C shows detection signals from the photodetectors 42a and 42b with respect to the angle, i.e., the difference between the selected wavelength λg and the oscillation wavelength λ in this arrangement.

FIG. 4D shows an output, i.e., an error signal, from the arithmetic unit 43 with respect to the difference between the selected wavelength λg and the oscillation wavelength λ.

Assume that the total power of a beam traveling toward each photodetector element is constant. In this case, when the beam moves from the center to the left, a detection signal Sa increases with an increase in the power of light detected by the left photodetector 42a, and a detection signal Sb from the right photodetector 42b decreases, as shown in FIG. 4C.

In this case, therefore, an error signal like the one shown in FIG. 4D can be obtained by calculating the difference (Sb−Sa) of the two detection signals using the arithmetic unit 43.

Note that variations in the total power of beam traveling toward each photodetector can be eliminated by calculating (Sb−Sa)/(Sb+Sa) using the arithmetic unit 43.

The discrimination sensitivity of the above error signal will be considered with reference to FIG. 5A to 5D.

Assume that the beam is a Gaussian beam. Consider a bisection photodetector that is sufficiently larger than the diameter of the beam.

Figure 5A:
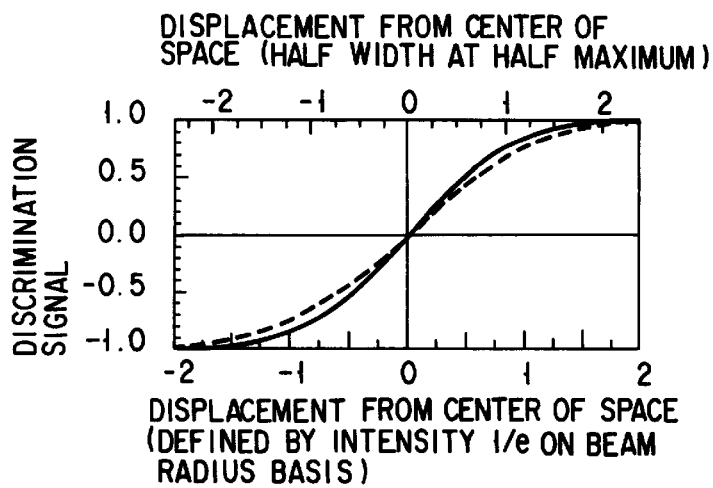
Figure 5B:
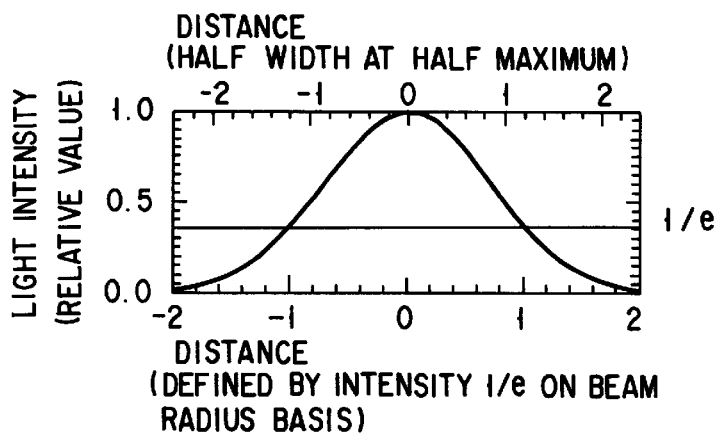

FIG. 5B shows the intensity distribution of the Gaussian beam. The abscissa takes the beam radius as a unit.

This beam radius is defined by the following two values: the distance at which the intensity decreases to 1/e (e is a natural logarithm) of the intensity at the center of the beam; and the distance (half width at half maximum) at which the intensity decreases to ½ the intensity at the center of the beam.

Figure 5C:
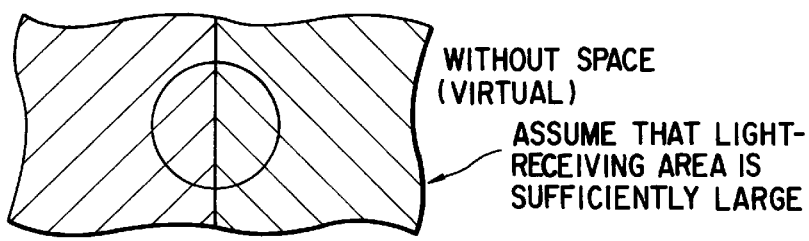
Figure 5D:
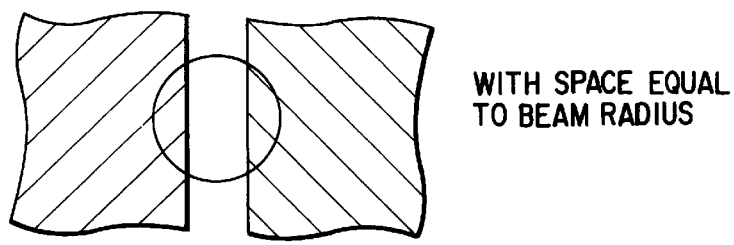

FIGS. 5C and 5D show examples of the shape of the light-receiving area of the bisection photodetector.

FIG. 5C shows a case wherein there is no space between the two light-receiving areas which are virtually divided. FIG. 5D shows a case wherein the space is equal to the beam radius defined by the intensity 1/e of the beam.

The circles in FIGS. 5C and 5D are drawn with the beam radius defined by the intensity 1/e of the beam, indicating the relationship between the width of the space and the diameter of the beam.

FIG. 5A shows discrimination signals Sb−Sa, when the input power is 1. Referring to FIG. 5A, the solid line represents the signal obtained in the case shown in FIG. 5C; and the dashed line, the signal obtained in the case shown in FIG. 5D. The origin of the abscissa corresponds to a case wherein the center of a beam is located on the division line.

The slope of this solid line near the origin in FIG. 5A, i.e., the discrimination sensitivity on a beam radius basis, is about 0.94 ($2(\log2/\pi)^{1/2}$), provided that the half width at half maximum (HWHM) indicated on the abscissa is regarded as a unit.

In practice, this slope is made moderate in accordance with the space between the light-receiving areas. Even with a space equal to the beam radius, a slope of about 0.8 can be obtained near the origin, as indicated by the dashed line.

In this case, since the diameter of a beam input on each photodetector can be arbitrarily changed by a lens or the like, if the diameter is set in accordance with the shape of each light-receiving area, a decrease in discrimination sensitivity due to this space poses no problem.

The wavelength resolution of the diffraction grating is a wavelength change amount in a case wherein the diffraction direction shifts by the half width at half maximum of the beam.

If, therefore, the difference between an oscillation wavelength and a selected wavelength is 1/10 the resolution of the diffraction grating, the discrimination signal has a sensitivity of about 0.08, which corresponds to about 8% on the full scale ("0" to "1" on the ordinate in FIG. 5A). This discrimination sensitivity is sufficiently high.

In the Littman mounting widely used in external cavity lasers using LDs, the ratio between the resolution of the diffraction grating and the FSR of the cavity is about 5 or less.

Effective control for this arrangement demands a discrimination sensitivity high enough to detect the difference between the oscillation wavelength λ and the selected wavelength λg with about 1/10 the resolution of the diffraction grating.

The value of the above error signal indicates that a signal that can be satisfactorily discriminated in observation with a low S/N ratio can be obtained.

In the case shown in FIG. 4A, initial adjustment is preferably made for the positions of the photodetectors to make two light reception signals as equal to each other as possible under a condition in which a mode hop is hard to occur. In the present invention, however, even if positional adjustment for the photodetectors is imperfect or their positions change over time, electrical processing of obtaining an error signal from detection signals can compensate for such a situation.

In calculating Sb−g·Sa using the arithmetic unit 43, changing a coefficient g positively and negatively almost amounts to simultaneously moving the photodetectors 42a and 42b to the right and left.

There is therefore no need to make mechanical adjustment for the photodetector portions upon uncovering and dismantling it.

Various arrangements other than the arrangement for splitting a diffracted beam and receiving the divided beams as shown in FIG. 4A are conceivable in association with the positions of the photodetectors 42a and 42b.

FIG. 6 shows an example of such arrangements.

More specifically, in this arrangement, light split by the beam splitter 41 is further split by a second beam splitter 44, and light-shielding plates 45a and 45b are disposed in the two optical paths formed upon splitting to allow the photodetectors 42a and 42b to receive beams from these optical paths.

If halves of the respective beams are respectively blocked by the light-shielding plates 45a and 45b, this arrangement becomes equivalent to the arrangement in FIG. 4A.

Assume that the light-shielding plate 45a is omitted. In this case, if, for example, the branch ratio of the second beam splitter 44 is 1:1, an error signal equivalent to the one shown in FIG. 4A can be obtained by calculating Sb−Sa/2 on the basis of the detection signals Sa and Sb using the arithmetic unit 43.

In this case, even if the total power of light corresponding to Sa changes, an error signal can be prevented from being affected by this change.

Alternatively, since the photodetector 42a outputs the detection signal Sa proportional to the total power of light split by the beam splitter 41, if the injection current to the LD to keep the signal Sa at a predetermined value S0, the arithmetic unit 43 may be designed to detect only the detection signal Sb to calculate Sb−S0/2.

In addition, the positions of the photodetectors 42a and 42b may be shifted from the centers of the respective beams to make halves of the beams strike the effective light-receiving areas without using the light-shielding plates 45a and 45b.

Since this embodiment is premised on feedback control, the two photodetectors are used to simplify the processing for the generation of an error signal from observation signals. However, the present invention may use a method of detecting the barycentric movement of the intensity distribution of a beam by using a CCD (Charge-Coupled Device) array or the like for one- or two-dimensionally detecting the intensity distribution of the beam or a method of using an element for converting the position of an irradiation point into an electrical resistance.

Note that a method of detecting light split by the beam splitter 41 in FIG. 4A, i.e., light traveling from the LD to the diffraction grating or output light, and using the optical power and one of the photodetectors 42a and 42b in FIG. 4A and a method of using only one of the photodetectors 42a and 42b in FIG. 4A are theoretically conceivable. In these methods, however, variations in diffraction efficiency and total power tend to affect an error signal.

Furthermore, the beam splitter 41 may not be used, and the photodetectors 42a and 42b may be inserted in parts of beams in the external cavity. In this case, however, the intensity distribution of each beam may be disturbed to decrease the resolution of the diffraction grating or stray light may be fed back -to the LD to result in unstable oscillation.

In feedback control, either or both of the cavity length and selected wavelength may be controlled. In general, however, the cavity length is set as an object for the following reason.

The oscillation wavelength exists in the selected wavelength range, and a plurality of resonance wavelengths exist. In an application designed to oscillate near a predetermined wavelength, it is natural that a selected wavelength is set, and the resonance wavelength is made to follow the selected wavelength.

When a given oscillation wavelength is to be changed greatly and discontinuously, it is difficult to quickly change the wavelength by using the method of making the selected wavelength follow the resonance wavelength.

In many cases, means for changing resonance and selected wavelengths are realized by using mechanical displacement. However, some limitations are imposed on the maximum displacement and displacement resolution of each changing means to be used.

If, therefore, selected wavelength follow-up method is easier to perform, the selected wavelength may be set as a control object.

Since the present invention can be implemented by the same concept regardless of the control objects, only the embodiments using the cavity length as a control object will be described later.

(Third Embodiment)

Since the embodiments according to the first and second aspects of the present invention described above are the same except for execution/inexecution of closed loop feedback control from the angle detection section 4, the embodiments according to the second aspect of the present invention will be described below.

Figure 7:
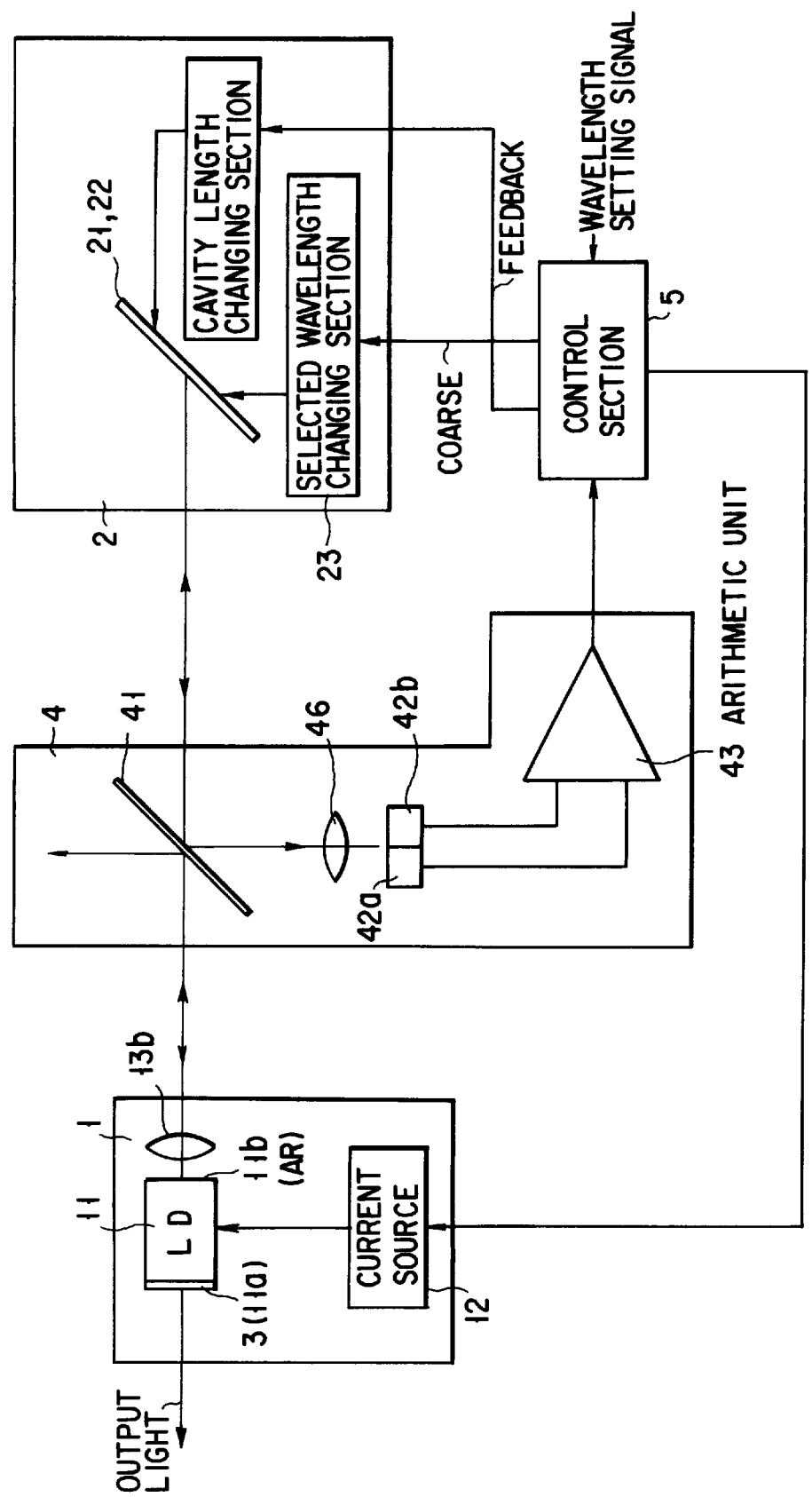
FIG. 7 is a block diagram showing a tunable laser source apparatus according to the third embodiment of the present invention.
Figure 9A:
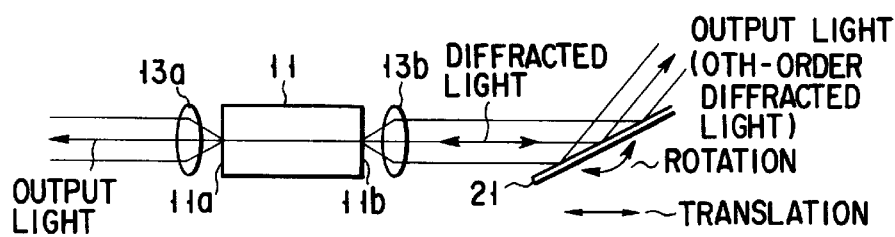
Figure 9B:
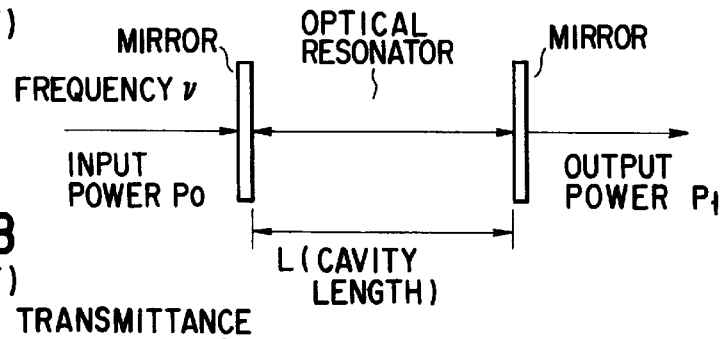
Figure 9C:
Figure 9D:
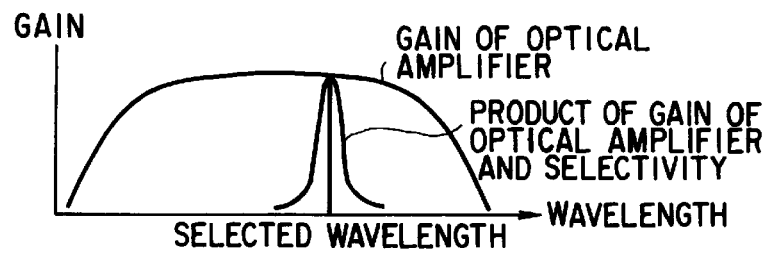
Figure 9E:
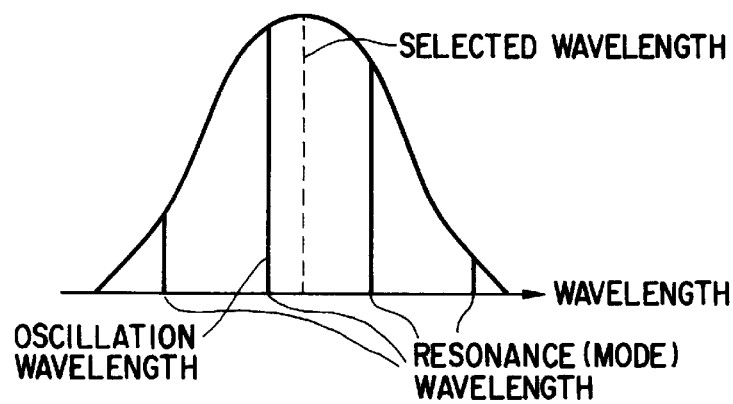

FIG. 7 is a block diagram showing a tunable laser source apparatus according to the third embodiment of the present invention.

In this embodiment, an angle detection section 4 is added to an external cavity laser using a diffraction grating based on the Littrow mounting, and an arrangement for closed loop feedback control is used.

As shown in FIG. 7, an optical amplification section 1 includes an LD 11, a current source 12, and a lens 13b.

One laser output end facet 11b of the LD 11 is covered with an AR coating, and the other laser output end facet 11a is used as a second reflector 3.

The LD 11 is driven by the current source 12.

The lens 13b collimates divergent light emerging from the end facet 11b covered with the AR coating and makes the light strike a diffraction section 2.

This diffraction section 2 includes a diffraction grating 21 positioned according to the Littrow mounting and also serving as a first reflector 22 and a mechanism (a selected wavelength changing section 23 and a cavity length changing section 24) for rotating and translating the diffraction grating 21.

The angle detection section 4 includes a beam splitter 41, a lens 46, photodetectors 42a and 42b, and an arithmetic unit 43.

The beam splitter 41 is disposed between the end facet 11b of the LD 11, which is covered with the AR coating, and the diffraction section 2 to split part of light traveling from the diffraction section 2 to the LD 11.

The lens 46 focuses the light split by the beam splitter 41.

In this embodiment, since collimated light is input on the lens 46, the diameter of the beam emerging from the lens 46 is minimized near the focal point.

The photodetectors 42a and 42b are disposed near the focal position of the lens 46 to respectively detect the powers of right and left halves of the beam demultiplexed by the beam splitter 41 at an oscillation wavelength at which no mode hop easily occurs.

The arithmetic unit 43 is a differential amplifier that detects signals from the photodetectors 42a and 42b and outputs the difference between the signals as an error signal.

The control section 5 sets the current source 12 and the diffraction section 2 in predetermined operation conditions on the basis of an external wavelength setting signal, and also controls the diffraction section 2 upon reception of the error signal output from the angle detection section 4.

Laser oscillation occurs at one resonance mode wavelength in the selected wavelength range on the basis of the cavity length of an external cavity formed between the output end facet 11a of the LD 11 and the diffraction grating 21 of the diffraction section 2.

Light fed back from the diffraction section 2 to the LD 11 is partly split by the beam splitter 41 in this external cavity, and the power of almost right and left halves of the split beam are received by the photodetectors 42a and 42b to be converted into electrical signals.

The two signals obtained in this manner are input to the arithmetic unit 43, in which the difference between the signals is calculated and converted into a signal almost proportional to the angle defined by the optical path of light traveling from the LD 11 to the diffraction section 2 and the optical path of light traveling from the diffraction section 2 to the LD 11.

This signal represents the difference between the oscillation wavelength and the selected wavelength, and includes information which wavelength is large/small.

The control section 5 feeds back this signal to the cavity length changing section (diffraction grating translating mechanism) 24 to close the control loop. As a result, the oscillation wavelength follows the selected wavelength.

In this case, since the two detection areas of the photodetectors 42a and 42b are preferably close to each other, this embodiment uses a photodiode having bisection light-receiving areas.

In this embodiment, the lens 46 is prepared, and the photodetectors 42a and 42b are disposed near the focal position of the lens 46 to maximize the discrimination sensitivity of the angle detection section 4 and shorten the distance from the beam splitter 41 to the photodetectors 42a and 42b.

In general, when a change in beam angle is to be detected from beam displacement on an observation plane, the distance from a portion where an angle change occurs to the observation plane is proportional to the beam displacement on the observation plane.

As the distance from the beam waist position to the observation plane increases, the beam diameter increases. However, these increases in distance and beam diameter do not exhibit a simple proportional relationship.

In an external cavity laser, since a beam at a portion where an angle change occurs is collimated beam, the portion where an angle change occurs can be regarded as the same as the beam waist position.

At a sufficient distance from the beam waist position, the distance to the observation plane and the beam diameter are almost proportional to each other. Near the beam waist, however, the beam diameter moderately increases.

In measuring a beam displacement on a beam radius basis, the greater the distance from the portion where an angle change occurs to the observation plane, the better.

In a numerical example, as for a Gaussian beam with a wavelength of 1.55 μm and a beam radius of 1 mm, the far end of the Fresnel zone is about 4 m away from the beam waist.

In this case, a beam displacement on a beam radius basis is about 0.7 ($=\frac{1}{2}^{1/2}$) times that at the infinity, and the observation plane is preferably positioned at a distance of 10 m or more from the beam waist.

In practice, however, positioning the observation plane at such a great distance leads to an increase in apparatus size. In addition, the performance of the apparatus tends to be affected by vibrations, fluctuations of air in an optical path, scattering, and the like.

In this embodiment, therefore, a reduced far field pattern is formed on the far-focal plane of the lens 46 to detect the light (on the plane).

In the above numeral example, when the observation plane is positioned at a distance of 10 in from the beam waist, the beam radius is about 2.7 mm, and a beam displacement of 1 mm occurs on the observation plane with an angle change of 0.1 mrad.

The beam displacement on a beam radius basis therefore becomes 1/2.7, i.e., nearly 0.37.

When a lens having a focal distance of 10 cm is used, the beam radius on the focal plane becomes 25 μm, the beam displacement on the observation plane with an angle change of 0.1 mrad becomes 10 μm.

The beam displacement on a beam radius basis therefore becomes 10/25, i.e., 0.4.

As is obvious from a comparison between these numerical examples, the best discrimination sensitivity can be obtained with the shortest distance by using the lens.

Furthermore, the lens 46 is used to match the diameter of a beam with the sizes of the light-receiving areas of the photodetectors 42a and 42b or the space therebetween.

In addition, since oscillation becomes unstable when light reflected by the areas of the photodetectors 42a and 42b returns to the laser resonator, optical isolators may be inserted in the optical paths formed upon split by the beam splitter 41.

In this case, the lens 46 can be effectively used to facilitate the insertion of the optical isolators.

In general, the radius of a beam traveling toward the diffraction grating 21 is set to several mm to increase the wavelength resolution of the diffraction grating 21.

Many commercial available photodetectors and optical isolators have effective diameters of 2 mm or less.

By thinning a beam using a lens, therefore, a deterioration in discrimination sensitivity due to an inappropriate beam diameter and vignetting by optical isolators can be prevented.

In this embodiment, for the sake of descriptive convenience, one convex lens is used. However, a plurality of lenses and spherical mirrors can be used in combination. Such an arrangement is effective when beam diameter adjustment is required.

(Fourth Embodiment)

FIG. 8 is a block diagram showing the arrangement of a tunable laser source apparatus according to the fourth embodiment of the present invention.

In this embodiment, an angle detection section 4 is added to an external cavity laser using a diffraction grating and mirror based on a Littman mounting because of (realizing) feedback control.

More specifically, as shown in FIG. 8, light input from an optical amplification section 1 onto a diffraction grating 21 is diffracted once, diffracted light (other than 0th-order diffracted light) is reflected by a mirror 22 as a first reflector, the reflected light is input on the diffraction grating 21 again, and the diffracted light is fed back to the optical amplification section 1.

Laser oscillation therefore occurs between one end facet 11a of an LD 11, which is a second reflector 3, the optical amplification section 1, the diffraction grating 21, and the mirror 22.

Such an arrangement is called a Littman mounting.

In the external cavity laser using the diffraction grating and mirror based on the Littman mounting, the selected wavelength can be changed by rotating the mirror 22, and the resonance wavelength can be changed by translating the mirror 22.

The arrangement and operation of a control section 5 are the same as those in the third embodiment except that the mirror 22 is controlled, and low- and high-frequency component control signals are respectively fed back to a cavity length changing section 24 and a current source 12.

Since the LD has the property of changing its internal refractive index depending on a current flowing in the active region or the phase control region, the cavity length of the external cavity can be changed by changing the driving current.

The cavity length is therefore determined by a control signal to the cavity length changing section 24 and a driving current from the current source 12 to the LD 11.

With the cavity in this embodiment, a high wavelength selectivity can be easily attained from the diffraction grating as compared with a cavity based on the Littrow mounting as in the third embodiment.

In this embodiment, therefore, since the diffraction angle greatly changes with a slight change in oscillation wavelength, the oscillation wavelength discrimination sensitivity improves. This can prevent a mode hop more reliably.

In addition, according to this embodiment, the cavity length of the external cavity can be quickly controlled by feeding back the high-frequency component of a control signal as an injection current to the LD.

This embodiment can therefore prevent a mode hop due to an external disturbance of a high-frequency component that cannot be mechanically followed up, such as a mode hop due to vibrations.

When a wavelength sweep is to be performed, the resonance wavelength must change following a sweep of the selected wavelength. As described above, by using current feedback to the LD, since this follow-up speed is high, a high wavelength follow-up speed can be set.

According to the first aspect of the present invention, since the means for detecting the difference between the oscillation wavelength and the selected wavelength, which is a cause of a mode hop, is provided for the external cavity laser in the above manner, a tunable laser source apparatus that allows easy and systematic adjustment for the prevention of a mode hop near a desired wavelength can be realized.

According to the second aspect of the present invention, a tunable laser source apparatus that can perform continuous wavelength sweeping in the entire oscillation band of an optical amplifier to be used, has high resistance to external disturbances and changes over time, and stably operates for a long period of time without adjustment can be realized by using the closed loop control method of preventing a mode hop in an external cavity laser by using a means for detecting the difference between the oscillation wavelength and the selected wavelength, which is a cause of the mode hop, and a means for performing feedback control to make the oscillation wavelength and the selected wavelength coincide with each other on the basis of the detection signal.

Furthermore, if feedback control is made for the tunable laser source apparatus of the present invention to correct a wavelength setting signal upon comparison with an externally set wavelength reference, a high wavelength accuracy can be easily obtained, which cannot be obtained by the tunable laser source apparatus of the present invention alone.

Such a secondary advantage can be obtained because the present invention improves controllability for an external wavelength setting signal.

Such a use application demands prevention of a mode hop as a premise.

According to the present invention described in detail above, therefore, there is provided a tunable laser source apparatus which includes an effective means for detecting the difference between the oscillation wavelength and the selected wavelength, which causes a mode hop, together with a sign, and can make systematic adjustment for the prevention of a mode hop independently of a trial-and-error method.

In addition, according to the present invention, there is provided a tunable laser source apparatus which can prevent a mode hop, continuously sweep the oscillation wavelength near a desired wavelength in the entire oscillation band of an optical amplification element, and has a long-term stability without adjustment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A tunable laser source apparatus comprising:

a semiconductor laser for oscillating laser light;

diffraction means for diffracting the laser light oscillated by said semiconductor laser and feeding back part, of diffracted laser light, which has a predetermined wavelength to said semiconductor laser; and angle detection means for detecting the part of the diffracted laser light fed back to said semiconductor laser and detecting an angle defined by an optical path of the diffracted laser light fed back to said semiconductor laser and an optical path of the laser light oscillated by said semiconductor laser.

2. An apparatus according to claim 1, wherein said diffraction means comprises a diffraction grating for diffracting the laser light oscillated by said semiconductor laser and feeding back part of diffracted laser light, which has a predetermined wavelength to said semiconductor laser, and driving means for driving said diffraction grating or a reflector disposed opposing said diffraction grating, said angle detection means comprises a beam splitter for splitting the part of the diffracted laser light fed back from said diffraction grating to said semiconductor laser, a photodetector for detecting laser light split by said beam splitter, and an arithmetic unit for detecting an angle of the optical path of the laser light fed back to said semiconductor laser with reference to the optical path of the laser light oscillated by said semiconductor laser based on detection signals from said photodetector, and said tunable laser source apparatus further comprises a current source for driving said semiconductor laser, and a control section for setting said current source and said driving means of said diffraction means in a predetermined operation condition based on an external wavelength setting signal.

3. An apparatus according to claim 2, wherein said angle detection means comprises a lens for focusing the laser light split by said beam splitter.

4. An apparatus according to claim 3, wherein said photodetector comprises a pair of photodetection elements disposed near a focal position of said lens to respectively detect power of right and left halves of the laser light split by said beam splitter at an oscillation wavelength at which a mode hop is hard to occur.

5. An apparatus according to claim 4, wherein said diffraction means comprises a selected wavelength changing section and cavity length changing section serving as said driving means to rotate and translate said diffraction grating, and is arranged according to a Littrow mounting in which said diffraction grating also serves as said reflector, and said control section sets said current source and said selected wavelength changing section of said diffraction means in a predetermined operation condition on the basis of the external wavelength setting signal, thereby causing laser oscillation in one resonance mode in a selected wavelength range based on a cavity length of an external cavity formed between said diffraction grating and the other end facet of said semiconductor laser which is covered with no AR coating.

6. An apparatus according to claim 4, wherein said pair of photodetectors comprise a photodiode having two divided light-receiving areas.

7. An apparatus according to claim 4, wherein said diffraction means comprises a selected wavelength changing section and cavity length changing section serving as said driving means to rotate and translate a reflector disposed opposing said diffraction grating, and is arranged according to a Littman mounting in which light input on said diffraction grating is diffracted once, diffracted light other than 0th-order diffracted light is reflected by said reflector to be input on said diffraction grating, and the diffracted light is fed back to said semiconductor laser, and said control section sets said current source and said selected wavelength changing section of said diffraction section in a predetermined operation condition based on the external wavelength setting signal, thereby causing laser oscillation in one resonance mode in a selected wavelength range based on a cavity length of an external cavity formed between said diffraction grating and the other end facet of said semiconductor laser which is covered with no AR coating.

8. A tunable laser source apparatus including an external cavity having a semiconductor laser having at least one laser output end facet covered with an AR coating and diffraction means including a reflector and a diffraction grating and having wavelength selectivity with which light emerging from the end facet of said semiconductor laser which is covered with the AR coating is received and light having a predetermined wavelength is selected and reflected toward said semiconductor laser, comprising:

angle detection means for detecting an angle defined by an optical path of the light emitted by said semiconductor laser and an optical path of the diffracted light reflected by said diffraction means; and a control section for controlling at least one of a cavity length of said external cavity and a wavelength selected by said diffraction means so as to set the angle detected by said angle detection means to zero.

9. An apparatus according to claim 8, wherein said tunable laser source apparatus further comprises a current source for driving said semiconductor laser, said diffraction means comprises a diffraction grating for diffracting laser light oscillated by said semiconductor laser and feeding back laser light, of the diffracted laser light, which has a predetermined wavelength to said semiconductor laser, and driving means for driving said diffraction grating or a reflector disposed opposing said diffraction grating, said angle detection means comprises a beam splitter for splitting part of the laser light fed back from said diffraction grating to said semiconductor laser, a photodetector for detecting the laser light split by said beam splitter, and an arithmetic unit for detecting an angle of an optical path of the laser light fed back to said semiconductor laser with reference to an optical path of the laser light oscillated by said semiconductor laser based on a detection signal from said photodetector, and said control section sets said current source and said driving means of said diffraction means in a predetermined operation condition based on an external wavelength setting signal, and controls at least said driving means of said diffraction means based on an angle detection signal output from said arithmetic unit of said angle detection means.

10. An apparatus according to claim 9, wherein said angle detection means comprises a lens for focusing the laser light split by said beam splitter.

11. An apparatus according to claim 10, wherein said photodetector comprises a pair of photodetector elements disposed near a focal position of said lens to respectively detect powers of right and left halves of the laser light split by said beam splitter at an oscillation wavelength at which a mode hop is hard to occur.

12. An apparatus according to claim 11, wherein said diffraction means comprises a selected wavelength changing section and cavity length changing section serving as said driving means to rotate and translate said diffraction grating, and is arranged according to a Littrow mounting in which said diffraction grating also serves as said reflector, and said control section sets said current source and said selected wavelength changing section of said diffraction means in a predetermined operation condition based on the external wavelength setting signal, and performs closed loop feedback control for at least said cavity length changing section of said diffraction means based on an angle detecting signal output from said arithmetic unit of said angle detection means, thereby causing laser oscillation in one resonance mode in a selected wavelength range based on a cavity length of an external cavity formed between said diffraction grating and the other end facet of said semiconductor laser which is covered with no AR coating.

13. An apparatus according to claim 11, wherein said pair of photodetector elements comprise a photodiode having bisection light-receiving areas.

14. An apparatus according to claim 11, wherein said diffraction means comprises a selected wavelength changing section and cavity length changing section serving as said driving means to rotate and translate a reflector disposed opposing said diffraction grating, and is arranged according to a Littman mounting in which light input on said diffraction grating is diffracted once, diffracted light other than 0th-order diffracted light is reflected by said reflector to be input on said diffraction grating, and the diffracted light is fed back to said optical amplification section, said control section sets said current source and said selected wavelength changing section of said diffraction means in a predetermined operation condition based on the external wavelength setting signal, feeds back, to said cavity length changing section of said diffraction means, a control signal of a low-frequency component of an angle detection signal output from said arithmetic unit of said angle detection means based on the angle detection signal.

15. An apparatus according to claim 14, wherein said control section performs closed loop feedback control by feeding back the control signal of the high-frequency component to said current source, thereby causing laser oscillation in one resonance mode in a selected wavelength range based on a cavity length of an external cavity formed between said diffraction grating and the other end facet of said semiconductor laser which is covered with no AR coating.

* * * * *